(12) United States Patent
Chern

(10) Patent No.: US 12,230,636 B2
(45) Date of Patent: *Feb. 18, 2025

(54) APPARATUS AND CIRCUITS WITH DUAL THRESHOLD VOLTAGE TRANSISTORS AND METHODS OF FABRICATING THE SAME

(71) Applicant: Taiwan Semiconductor Manufacturing Co., Ltd., Hsinchu (TW)

(72) Inventor: Chan-Hong Chern, Palo Alto, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/198,195

(22) Filed: May 16, 2023

(65) Prior Publication Data

US 2023/0290782 A1    Sep. 14, 2023

Related U.S. Application Data

(63) Continuation of application No. 16/575,808, filed on Sep. 19, 2019, now Pat. No. 11,682,676.

(Continued)

(51) Int. Cl.
*H01L 27/095*    (2006.01)
*H01L 21/02*    (2006.01)
(Continued)

(52) U.S. Cl.
CPC ........ *H01L 27/095* (2013.01); *H01L 21/0254* (2013.01); *H01L 21/8252* (2013.01);
(Continued)

(58) Field of Classification Search
CPC .......................... H01L 27/0605; H01L 27/085
See application file for complete search history.

(56) References Cited

U.S. PATENT DOCUMENTS 8,283,734 B2    10/2012  Chiang et al.
2004/0155281 A1    8/2004  Osada et al.
(Continued)

OTHER PUBLICATIONS

Li et al. "Threshold Voltage Control in Al0.72Ga0.28N/AlN/GaN HEMTS by Work-Function Engineering," 954 IEEE Electron Device Letters, vol. 31, No. 9, Sep. 2010 (Year: 2010).

(Continued)

*Primary Examiner* — Matthew L Reames
(74) *Attorney, Agent, or Firm* — Duane Morris LLP

(57) ABSTRACT

Apparatus and circuits with dual threshold voltage transistors and methods of fabricating the same are disclosed. In one example, a semiconductor structure is disclosed. The semiconductor structure includes: a substrate; a first layer comprising a first III-V semiconductor material formed over the substrate; a first transistor formed over the first layer, and a second transistor formed over the first layer. The first transistor comprises a first gate structure comprising a first material, a first source region and a first drain region. The second transistor comprises a second gate structure comprising a second material, a second source region and a second drain region. The first material is different from the second material.

20 Claims, 19 Drawing Sheets

Related U.S. Application Data

(60) Provisional application No. 62/753,484, filed on Oct. 31, 2018.

(51) Int. Cl.
| | |
|---|---|
| *H01L 21/8252* | (2006.01) |
| *H01L 29/20* | (2006.01) |
| *H01L 29/205* | (2006.01) |
| *H01L 29/423* | (2006.01) |
| *H01L 29/49* | (2006.01) |
| *H01L 29/66* | (2006.01) |
| *H01L 29/778* | (2006.01) |
| *H03K 17/16* | (2006.01) |

(52) U.S. Cl.
CPC ........ *H01L 29/2003* (2013.01); *H01L 29/205* (2013.01); *H01L 29/4958* (2013.01); *H01L 29/66462* (2013.01); *H01L 29/7787* (2013.01); *H03K 17/161* (2013.01); *H01L 21/02381* (2013.01); *H01L 29/42316* (2013.01)

(56) References Cited

U.S. PATENT DOCUMENTS

| | | |
|---|---|---|
| 2010/0019279 A1 | 1/2010 | Chen et al. |
| 2016/0372557 A1 | 12/2016 | Liao |

OTHER PUBLICATIONS

Greco et al."Review of technology for normally- HEMTs with p-GaN gate," Matherials Science in Semiconductor processing 78 96-106, 2017 (Year: 2017).

APPARATUS AND CIRCUITS WITH DUAL THRESHOLD VOLTAGE TRANSISTORS AND METHODS OF FABRICATING THE SAME

RELATED APPLICATION

This application is a continuation of U.S. patent application Ser. No. 16/575,808, filed Sep. 19, 2019, which claims priority to U.S. Provisional Patent Application No. 62/753,484, entitled "APPARATUS WITH DUAL THRESHOLD VOLTAGE TRANSISTORS AND METHOD OF FABRICATING THE SAME," and filed on Oct. 31, 2018, the entirety of each are incorporated by reference herein in their entireties.

BACKGROUND

In an integrated circuit (IC), an enhancement-mode N-type transistor, e.g. enhancement-mode high-electron-mobility transistor (E-HEMT), may be used as a pull-up device to minimize static current. In order to achieve near full-rail pull-up voltage and fast slew rate, a significantly large over-drive voltage is needed for an N-Type enhancement-mode transistor. That is, the voltage difference between gate and source (Vgs) should be much larger than the threshold voltage (Vt), i.e. (Vgs−Vt>>0). It is imperative to use a multi-stage E-HEMT based driver for integrated circuit to minimize static current. Nevertheless, multi-stage E-HEMT based drivers will not have enough over-drive voltage (especially for the last-stage driver) due to one Vt drop across each stage of E-HEMT pull-up device and one forward voltage (Vf) drop across boot-strap diode. Although one can reduce the Vt for the pull-up E-HEMT transistors and Vf of diode-connected E-HEMT rectifier of multi-stage drivers to provide significantly enough over-drive voltage and dramatically reduce static current, the noise immunity will be compromised.

In an existing semiconductor wafer, transistors formed on the wafer have identical structure such that they have a same threshold voltage Vt. When Vt of one transistor is reduced, Vt's of other transistors on the wafer are reduced accordingly. As Vt being reduced in this case, a power switch HEMT driven by the HEMT-based driver will have a poor noise immunity because the power switch HEMT cannot withstand a large back-feed-through impulse voltage to its gate. Thus, existing apparatus and circuits including multiple transistors are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIGS. 3A, 3B, 3C, 3D, 3E, 3F, 3G, 3H, 3I, 3J, 3K, 3L, 3M, 3N and 3O illustrate cross-sectional views of an exemplary semiconductor device during various fabrication stages, in accordance with some embodiments of the present disclosure.

DETAILED DESCRIPTION OF EXEMPLARY EMBODIMENTS

Figure 1:
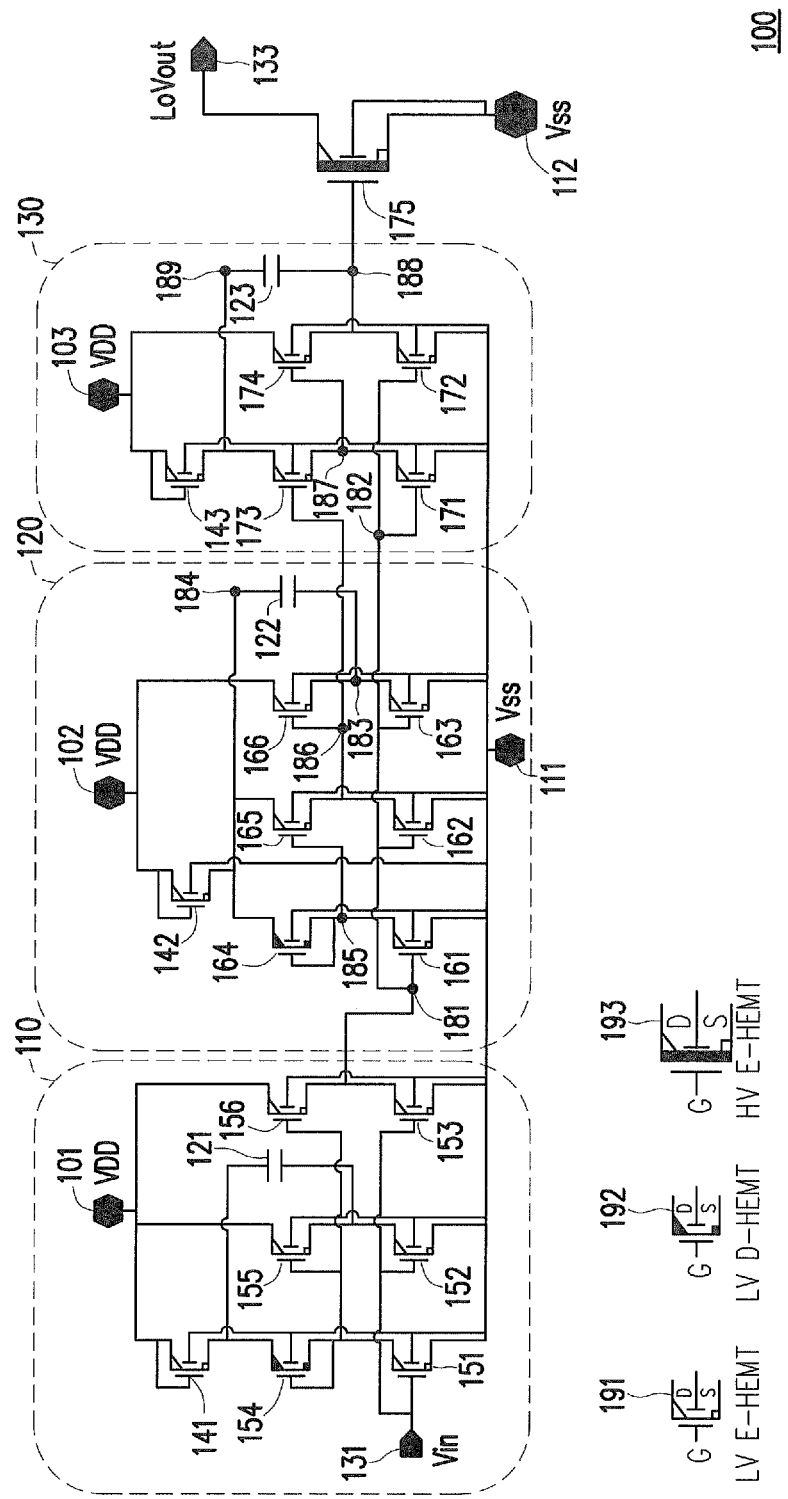
FIG. 1 illustrates an exemplary circuit having a multi-stage boot-strapped driver, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

An enhancement-mode high-electron-mobility transistor (HEMT), e.g. a gallium nitride (GaN) HEMT, has superior characteristics to enable high performance and smaller form factor in power conversion and radio frequency power amplifier and power switch applications compared to silicon based transistors. But there is no viable p-type HEMT available mostly due to much lower p-type mobility and partly due to two dimensional hole gas (2DHG) band structure. While n-type GaN HEMTs are used in an integrated circuit, to minimize static current, the pull-up devices are mostly based on enhancement-mode n-type transistors rather than depletion-mode n-type transistors.

A multi-stage HEMT based driver can be used for an integrated circuit to minimize static current. But multi-stage HEMT based drivers will not have enough over-drive voltage (especially for the last-stage driver) due to one threshold voltage (Vt) drop across each stage of HEMT pull-up device and one forward voltage (Vf) drop across boot-strap diode. Although one can reduce the Vt for the pull-up HEMT transistors and Vf of diode-connected HEMT rectifier of multi-stage drivers to provide significantly enough over-drive voltage and dramatically reduce static current, the noise immunity will be compromised.

Instead of reducing a single value of the threshold voltage (Vt) of the HEMT transistors in an IC, the present teaching discloses apparatus and circuits including dual-Vt transistors and their fabrication process. In one embodiment, two transistors formed on a same wafer have different Vt's. In particular, two transistors have different metal gate materials for their gates respectively to obtain different Vt's from each other. While a lower work-function material, e.g. tungsten (W) or titanium/tungsten/titanium-nitride (Ti/W/TiN) metal stack, can be used for implementing a high-Vt HEMT; a higher work-function material, e.g. nickel (Ni) or titanium/nickel/titanium-nitride (Ti/Ni/TiN) metal stack, can be used for implementing a low-Vt HEMT. In an exemplary method of fabricating the dual-Vt transistors, the two metal gates can be formed on a polarization modulation layer by depositing and polishing different work-function materials with a mask.

The disclosed apparatus can adjust the work function differences in the metal-gate to create dual-Vt (or various-Vt) transistors on a same semiconductor wafer; and generate different amount of 2-Dimensional Electron Gas (2-DEG) for transistors at different locations of the same wafer at thermal equilibrium.

The present disclosure is applicable to any transistor based IC. The proposed apparatus and methods can enable a transistor based IC to reduce the static current significantly and have significantly large over-drive voltages for drivers of concern; without compromising noise immunity while increasing over-drive voltages and reducing static currents. In addition, the disclosed apparatus and methods can provide IC designers the flexibility of using different Vt devices for specific functions of improving performance, reducing static current, improving noise immunity, etc.

FIG. 1 illustrates an exemplary circuit 100 having a multi-stage boot-strapped driver, in accordance with some embodiments of the present disclosure. As shown in FIG. 1, the circuit 100 includes a driver having multiple stages 110, 120, 130 serially connected to drive a power switch HEMT 175. Each stage includes multiple transistors.

The stage 110 in this example includes transistors 141, 151, 152, 153, 154, 155, 156. In one embodiment, among these transistors, the transistor 154 is a low voltage depletion-mode high electron mobility transistor (LV D-HEMT) 192; while each of the other transistors 141, 151, 152, 153, 155, 156 is a low voltage enhancement-mode high electron mobility transistor (LV E-HEMT) 191.

As shown in FIG. 1, the gate of the transistor 151 is electrically connected to an input pin 131 of the circuit 100. The input pin 131 has an input voltage Vin ranged from a low logic state voltage (e.g. 0V) to a high logic state voltage (e.g. 6V). When the circuit 100 is turned off, the Vin is 0. The circuit 100 is turned on after the Vin is increased to 6V. The transistor 151 has a source electrically connected to ground Vss 111 which has a ground voltage 0V; and has a drain electrically connected to a source of the transistor 154. The transistor 152 in this example has a gate electrically connected to the input pin 131, a source electrically connected to the ground Vss 111 which has a ground voltage 0V, and a drain electrically connected to a source of the transistor 155. Similarly, the transistor 153 in this example has a gate electrically connected to the input pin 131, a source electrically connected to the ground Vss 111 which has a ground voltage 0V, and a drain electrically connected to a source of the transistor 156.

The transistor 154 in this example has a gate electrically connected to its own source, which is electrically connected to the drain of the transistor 151. Drain of the transistor 154 is electrically connected to a source of the transistor 141. The transistor 155 in this example has a gate electrically connected to the source of the transistor 154 and electrically connected to the drain of the transistor 151. The transistor 155 has a source electrically connected to the drain of the transistor 152, and a drain electrically connected to a power supply pin VDD 101 which has a positive power supply voltage (e.g. 6V). Similarly, the transistor 156 in this example has a gate electrically connected to the source of the transistor 154 and electrically connected to the drain of the transistor 151, a source electrically connected to the drain of the transistor 153, and a drain electrically connected to the power supply pin VDD 101 which has a positive power supply voltage 6V.

The transistor 141 in this example has a gate electrically connected to its own drain, which is electrically connected to the power supply pin VDD 101 which has a positive power supply voltage 6V. The transistor 141 connected in this specific configuration is functioning like a rectifier or diode and is conventionally called as a diode-connected transistor. Source of the transistor 141 is electrically connected to the drain of the transistor 154. The stage 110 further includes a capacitor 121 coupled between the source of the transistor 141 and the source of the transistor 155.

The stage 120 in this example includes transistors 142, 161, 162, 163, 164, 165, 166. In one embodiment, among these transistors, the transistor 164 is a low voltage depletion-mode high electron mobility transistor (LV D-HEMT) 192; while each of the other transistors 142, 161, 162, 163, 165, 166 is a low voltage enhancement-mode high electron mobility transistor (LV E-HEMT) 191.

As shown in FIG. 1, the gate of the transistor 161 is electrically connected to a node 181, which is electrically connected to the source of the transistor 156 and the drain of the transistor 153. The node 181 has a voltage ranged between Vss and VDD (0 and 6V). When the circuit 100 is turned off, the Vin is 0, such that the transistor 153 is turned off and the transistor 156 is turned on. The node 181 has the same voltage 6V as the power supply pin VDD 101. When the circuit 100 is turned on and the Vin has a voltage of 6V, the transistor 153 is turned on and the transistor 156 is turned off. The node 181 has the same voltage 0V as the ground Vss 111.

The transistor 161 has a source electrically connected to ground Vss 111 which has a ground voltage 0V; and has a drain electrically connected to a source of the transistor 164. The transistor 162 in this example has a gate electrically connected to the node 181, a source electrically connected to the ground Vss 111 which has a ground voltage 0V, and a drain electrically connected to a source of the transistor 165. Similarly, the transistor 163 in this example has a gate electrically connected to the node 181, a source electrically connected to the ground Vss 111 which has a ground voltage 0V, and a drain electrically connected to a source of the transistor 166.

The transistor 164 in this example has a gate electrically connected to its own source, which is electrically connected to the drain of the transistor 161. Drain of the transistor 164 is electrically connected to a source of the transistor 142. The transistor 165 in this example has a gate electrically connected to a node 185, which is electrically connected to the source of the transistor 164 and electrically connected to the drain of the transistor 161. The transistor 165 has a source electrically connected to the drain of the transistor 162, and a drain electrically connected to the source of the transistor 142. The transistor 166 in this example has a gate electrically connected to a node 186, which is electrically connected to the source of the transistor 165 and electrically connected to the drain of the transistor 162, a source electrically connected to the drain of the transistor 163, and a drain electrically connected to a power supply pin VDD 102 which has a positive power supply voltage (e.g. 6V).

The transistor 142 in this example has a gate electrically connected to its own drain (i.e. diode-connected to act like a rectifier or diode), which is electrically connected to the power supply pin VDD 102 which has a positive power supply voltage 6V. Source of the transistor 142 is electrically connected to the drain of the transistor 164 and the drain of the transistor 165. The stage 120 further includes a capacitor 122 coupled between a node 184 electrically connected to the source of the transistor 142 and a node 183 electrically connected to the source of the transistor 166.

The stage 130 in this example includes transistors 143, 171, 172, 173, 174. In one embodiment, each of these transistors is a low voltage enhancement-mode high electron mobility transistor (LV E-HEMT) 191. As shown in FIG. 1, the gate of the transistor 171 is electrically connected to a node 182, which is electrically connected to the node 181, the source of the transistor 156 and the drain of the transistor 153. Same as the node 181, the node 182 has a voltage ranged between Vss and VDD (0 and 6V). When the circuit 100 is turned off, the Vin is 0, such that the transistor 153 is turned off and the transistor 156 is turned on. The node 181 and the node 182 have the same voltage 6V as the power supply pin VDD 101. When the circuit 100 is turned on and the Vin has a voltage of 6V, the transistor 153 is turned on and the transistor 156 is turned off. The node 181 and the node 182 have the same voltage 0V as the ground Vss 111.

The transistor 171 has a source electrically connected to ground Vss 111 which has a ground voltage 0V; and has a drain electrically connected to a source of the transistor 173. The transistor 172 in this example has a gate electrically connected to the node 182, a source electrically connected to the ground Vss 111 which has a ground voltage 0V, and a drain electrically connected to a source of the transistor 174.

The transistor 173 in this example has a gate electrically connected to the node 186, which is electrically connected to the source of the transistor 165. The transistor 173 has a source electrically connected to the drain of the transistor 171, and a drain electrically connected to a source of the transistor 143. The transistor 174 in this example has a gate electrically connected to a node 187, which is electrically connected to the source of the transistor 173 and electrically connected to the drain of the transistor 171. The transistor 174 has a source electrically connected to the drain of the transistor 172, and a drain electrically connected to a power supply pin VDD 103 which has a positive power supply voltage (e.g. 6V).

The transistor 143 in this example has a gate electrically connected to its own drain (i.e. diode-connected to act like a rectifier or diode), which is electrically connected to the power supply pin VDD 103 which has a positive power supply voltage 6V. Source of the transistor 143 is electrically connected to the drain of the transistor 173. The stage 130 further includes a capacitor 123 coupled between a node 189 electrically connected to the source of the transistor 143 and a node 188 electrically connected to the source of the transistor 174.

As such, the stages 110, 120, 130 are serially connected to form a multi-stage driver that drives a power switch transistor 175. In one embodiment, the power switch HEMT 175 is a high voltage enhancement-mode high electron mobility transistor (HV E-HEMT) 193. As shown in FIG. 1, the power switch HEMT 175 has a gate electrically connected to the node 188, a source electrically connected to ground Vss 112 which has a ground voltage 0V, and a drain electrically connected to an output pin 133 of the circuit 100. In some embodiments, the circuit 100 can serve as a low-side driver in a half-bridge or full-bridge power converter, where the output pin 133 serves as a low-side voltage output (LoVout).

Most transistors in FIG. 1 are enhancement-mode N-type transistors. That is, the circuit 100 uses mostly enhancement-mode N-type transistors as pull-up devices to minimize static current. In order to achieve near full-rail pull-up voltage and fast slew rate, a significantly large over-drive voltage is needed for the N-Type enhancement-mode transistor. That is, the voltage difference between gate and source (Vgs) should be much larger than the threshold voltage (Vt), i.e. (Vgs−Vt>>0). While the multi-stage driver of the circuit 100 can minimize static current, each stage of E-HEMT pull-up device consumes at least one Vt voltage drop.

As discussed above, the node 181 has a voltage ranged between Vss and VDD (0 and 6V). When the circuit 100 is turned off, the Vin is 0, such that the transistor 153 is turned off and the transistor 156 is turned on. The node 181 has the same voltage 6V as the power supply pin VDD 101, which enables the transistors 161, 162, 163 to be turned on. As such, the node 185 is electrically connected to the ground Vss 111, and has a voltage close to 0V. As such, the transistor 165 is turned off, and the node 186 is electrically connected to the ground Vss 111 and has a voltage 0V. Accordingly, the transistor 166 is turned off, and the node 183 is electrically connected to the ground Vss 111 and has a voltage 0V. In this case, the capacitor 122 is charged by the power supply pin VDD 102 via the transistor 142. In this example, the transistor 142 is a diode-connected HEMT used as a rectifying diode, which naturally has a forward voltage (Vf). That is, the voltage at the node 184 will maximally be charged to 6V−Vf. In a first example, assuming the forward voltages and threshold voltages of all transistors in FIG. 1 are equal to 1.5V, the maximum voltage at the node 184 when the circuit 100 is turned off is 6V−1.5V=4.5V.

When the circuit 100 is turned on and the Vin has a voltage of 6V, the transistor 153 is turned on and the transistor 156 is turned off. The node 181 has the same voltage 0V as the ground Vss 111, which enables the transistors 161, 162, 163 to be turned off. As such, the node 185 is electrically connected to the node 184, and has a same voltage as the node 184. This induces the transistor 165 to be turned on, which enables the node 186 to be charged by the voltage at the node 184. This in turn induces the transistor 166 to be turned on, which enables the node 183 to be charged by the power supply pin VDD 102. As such, the voltage at the node 183 can maximally be charged to 6V, same as the voltage of the power supply pin VDD 102. Based on the 4.5V voltage difference stored by the capacitor 122 when the circuit 100 is off, the voltage at the node 184 can maximally be charged and increased to 6V+4.5V=10.5V, i.e. the voltage at the node 184 is boot-strapped to 10.5V. Accordingly, the node 185, which is electrically connected to both the source and the gate of the transistor 164, is charged to 10.5V as well.

While the node 186 is also charged by the voltage 10.5V at the node 184, the voltage of the node 186 cannot reach 10.5V. Because the node 186 is electrically connected to the source of the transistor 165, to keep the transistor 165 on, the gate source voltage difference Vgs of the transistor 165 must be larger than the threshold voltage (Vt) of the transistor 165. As it is assumed Vt=1.5V in the first example, the maximum voltage the node 186 can reach in the first example when the circuit 100 is turned on is 10.5V−Vt=10.5V−1.5V=9V. As such, an enhancement-mode high-electron-mobility transistor (E-HEMT) pull-up device consumes at least one Vt voltage drop.

The node 182 is electrically connected to the node 181 and has a same voltage as that of the node 181. That is, when the circuit 100 is turned off, the node 182 has the voltage 6V; when the circuit 100 is turned on, the node 182 has the voltage 0V. When the circuit 100 is turned off, the 6V voltage at the node 182 enables the transistors 171, 172 to be turned on. As such, the node 187 is electrically connected to the ground Vss 111, and has a voltage 0V. Here, the transistor 173 is turned off due to the 0V voltage at the node 186 when the circuit 100 is turned off as discussed above. Because the node 187 has the voltage 0V, the transistor 174 is turned off, and the node 188 is electrically connected to the ground Vss 111 and has a voltage 0V. In this case, the capacitor 123 is charged by the power supply pin VDD 103 via the transistor 143. In this example, the transistor 143 is a diode-connected HEMT used as a rectifying diode, which naturally has a forward voltage (Vf). That is, the voltage at the node 189 will maximally be charged to 6V−Vf. In the first example, assuming the forward voltages and threshold voltages of all transistors in FIG. 1 are equal to 1.5V, the maximum voltage at the node 189 when the circuit 100 is turned off is 6V−1.5V=4.5V.

When the circuit 100 is turned on, the node 182, like the node 181, has the same voltage 0V as the ground Vss 111, which enables the transistors 171, 172 to be turned off. As discussed above, the node 186, which is electrically connected to the gate of the transistor 173, has a maximum voltage of 9V when the circuit 100 is turned on. As such, the transistor 173 is turned on and the node 187 is charged by the node 189. This induces the transistor 174 to be turned on, which enables the node 188 to be charged by the power supply pin VDD 103. As such, the voltage at the node 188 can maximally be charged to 6V, same as the voltage of the power supply pin VDD 102. Based on the 4.5V voltage difference stored by the capacitor 123 when the circuit 100 is off, the voltage at the node 189 can maximally be charged and increased to 6V+4.5V=10.5V, i.e. the voltage at the node 189 is boot-strapped to 10.5V.

While the node 187 is charged by the voltage 10.5V at the node 189, the voltage of the node 187 cannot reach 10.5V. Because the node 187 is electrically connected to the source of the transistor 173, to keep the transistor 173 on, the gate source voltage difference Vgs of the transistor 173 must be larger than the threshold voltage (Vt) of the transistor 173. The gate of the transistor 173 is electrically connected to the node 186, which has a maximum voltage 9V when the circuit 100 is turned on. As it is assumed Vt=1.5V in the first example, the maximum voltage the node 187 can reach in the first example when the circuit 100 is turned on is 9V−Vt=9V−1.5V=7.5V. Now the transistor 174 has a gate source voltage difference Vgs=7.5V−6V=1.5V, which is exactly equal to the threshold voltage Vt=1.5V of the transistor 174. This leaves no voltage margin at the last stage of the multi-stage boot-strapped driver. That is, in the first example where Vf=Vt=1.5V, there is not enough over-drive voltage to drive the power switch HEMT 175. Even if the power switch HEMT 175 can be driven, it would be significantly slow as the current flowing through the transistor 174 and the node 188 would be very slow due to no Vgs margin compared to the Vt. The above conclusion has not even taken into consideration of the Vt variation (e.g. 3-σ variation of 0.5V), which typically exists in all process technologies. After counting the 3-σ variation of 0.5V, the circuit 100, under the Vt=1.5V assumption, may not be able to drive the power switch HEMT 175 at all.

In a second example, it is assumed the forward voltages and threshold voltages of all transistors in FIG. 1 are equal to 1V. In this case, when the circuit 100 is turned off, the node 181 has the same voltage 6V, which enables the transistors 161, 162, 163 to be turned on. As such, the node 185 is electrically connected to the ground Vss 111 and has a voltage 0V. As such, the transistor 165 is turned off, and the node 186 is electrically connected to the ground Vss 111 and has a voltage 0V. Accordingly, the transistor 166 is turned off, and the node 183 is electrically connected to the ground Vss 111 and has a voltage 0V. The capacitor 122 is charged by the power supply pin VDD 102 via the transistor 142. Because the transistor 142 is a diode-connected HEMT used as a rectifying diode which naturally has a forward voltage (Vf), the node 184 can have a maximum voltage of 6V−Vf=6V−1V=5V.

When the circuit 100 is turned on, the node 181 has the same voltage 0V as the ground Vss 111, which enables the transistors 161, 162, 163 to be turned off. As such, the node 185 is electrically connected to the node 184, and has a same voltage as the node 184. This induces the transistor 165 to be turned on, which enables the node 186 to be charged by the voltage at the node 184. This in turn induces the transistor 166 to be turned on, which enables the node 183 to be charged by the power supply pin VDD 102. As such, the node 183 has a maximum voltage of 6V, same as the voltage of the power supply pin VDD 102. Based on the 5V voltage difference stored by the capacitor 122 when the circuit 100 is off, the voltage at the node 184 can maximally be charged and increased to 6V+5V=11V, i.e. the voltage at the node 184 is boot-strapped to 11V. Accordingly, the node 185, which is electrically connected to both the source and the gate of the transistor 164, is charged to 11V as well. While the node 186 is also charged by the voltage 11V at the node 184, the voltage of the node 186 cannot reach 11V. Because the node 186 is electrically connected to the source of the transistor 165, to keep the transistor 165 on, the gate source voltage difference Vgs of the transistor 165 must be larger than the threshold voltage (Vt) of the transistor 165. As it is assumed Vt=1V in the second example, the maximum voltage the node 186 can reach in the second example when the circuit 100 is turned on is 11V−Vt=11V−1V=10V.

The node 182 is electrically connected to the node 181 and has a same voltage as that of the node 181. That is, when the circuit 100 is turned off, the node 182 has the voltage 6V; when the circuit 100 is turned on, the node 182 has the voltage 0V. When the circuit 100 is turned off, the 6V voltage at the node 182 enables the transistors 171, 172 to be turned on. As such, the node 187 is electrically connected to the ground Vss 111, and has a voltage 0V. Here, the transistor 173 is turned off due to the 0V voltage at the node 186 when the circuit 100 is turned off as discussed above. Because the node 187 has the voltage 0V, the transistor 174 is turned off, and the node 188 is electrically connected to the ground Vss 111 and has a voltage 0V. In this case, the capacitor 123 is charged by the power supply pin VDD 103 via the transistor 143. Because the transistor 143 is a diode-connected HEMT used as a rectifying diode which naturally has a forward voltage (Vf), the node 189 has a maximum voltage of 6V−Vf=6V−1V=5V.

When the circuit 100 is turned on, the node 182, like the node 181, has the same voltage 0V as the ground Vss 111, which enables the transistors 171, 172 to be turned off. As discussed above, the node 186, which is electrically connected to the gate of the transistor 173, has a maximum voltage of 10V when the circuit 100 is turned on. As such, the transistor 173 is turned on and the node 187 is charged by the node 189. This induces the transistor 174 to be turned on, which enables the node 188 to be charged by the power supply pin VDD 103. As such, the voltage at the node 188 can maximally be charged to 6V, same as the voltage of the power supply pin VDD 102. Based on the 5V voltage difference stored by the capacitor 123 when the circuit 100 is off, the voltage at the node 189 can maximally be charged and increased to 6V+5V=11V, i.e. the voltage at the node 189 is boot-strapped to 11V.

While the node 187 is charged by the voltage 11V at the node 189, the voltage of the node 187 cannot reach 11V. Because the node 187 is electrically connected to the source of the transistor 173, to keep the transistor 173 on, the gate source voltage difference Vgs of the transistor 173 must be larger than the threshold voltage (Vt) of the transistor 173. The gate of the transistor 173 is electrically connected to the node 186, which has a maximum voltage 10V when the circuit 100 is turned on. As it is assumed Vt=1V in the second example, the maximum voltage the node 187 can reach in the second example when the circuit 100 is turned on is 10V−Vt=10V−1V=9V. Now the transistor 174 has a gate source voltage difference Vgs=9V−6V=3V, which is much larger than the threshold voltage Vt=1V of the transistor 174. This leaves enough voltage margin at the last stage of the multi-stage boot-strapped driver. That is, in the second example where Vf=Vt=1V, there is enough overdrive voltage to drive the power switch HEMT 175. However, since all transistors, including the power switch HEMT 175, in FIG. 1 are using a same Vt, a reduced Vt at the power switch HEMT 175 may cause the noise immunity of the output power switch 175 become significantly worse due to not being able to withstand a large back-feed-through impulse (di/dt) voltage to the gate of the output power switch 175. Because there is inevitable parasitic capacitance between the drain and the gate of the power switch HEMT 175, a voltage impulse will feed back from the drain of the power switch HEMT 175 to the gate of the power switch HEMT 175 through the parasitic capacitance. This could accidently turn on the power switch HEMT 175 so long as the noise voltage is larger than the reduced Vt of the power switch HEMT 175, even when the circuit 100 is turned off.

As such, in a third example, the forward voltages and threshold voltages of all transistors in FIG. 1 are not all the same. In the third example, it is assumed that the transistors 142, 143, 165, 166, 173, 174 have a smaller Vt of 1V, while the other transistors in FIG. 1 have a larger Vt of 1.5V. In this case, when the circuit 100 is turned off, the node 181 has the same voltage 6V, which enables the transistors 161, 162, 163 to be turned on. As such, the node 185 is electrically connected to the ground Vss 111 and has a voltage 0V. As such, the transistor 165 is turned off, and the node 186 is electrically connected to the ground Vss 111 and has a voltage 0V. Accordingly, the transistor 166 is turned off, and the node 183 is electrically connected to the ground Vss 111 and has a voltage 0V. The capacitor 122 is charged by the power supply pin VDD 102 via the transistor 142. Because the transistor 142 has a forward voltage Vf equal to its Vt, the node 184 can have a maximum voltage of 6V−Vf=6V−1V=5V.

When the circuit 100 is turned on, the node 181 has the same voltage 0V as the ground Vss 111, which enables the transistors 161, 162, 163 to be turned off. As such, the node 185 is electrically connected to the node 184, and has a same voltage as the node 184. This induces the transistor 165 to be turned on, which enables the node 186 to be charged by the voltage at the node 184. This in turn induces the transistor 166 to be turned on, which enables the node 183 to be charged by the power supply pin VDD 102. As such, the node 183 has a maximum voltage of 6V, same as the voltage of the power supply pin VDD 102. Based on the 5V voltage difference stored by the capacitor 122 when the circuit 100 is off, the voltage at the node 184 can maximally be charged and increased to 6V+5V=11V, i.e. the voltage at the node 184 is boot-strapped to 11V. Accordingly, the node 185, which is electrically connected to both the source and the gate of the transistor 164, is charged to 11V as well. While the node 186 is also charged by the voltage 11V at the node 184, the voltage of the node 186 cannot reach 11V. Because the node 186 is electrically connected to the source of the transistor 165, to keep the transistor 165 on, the gate source voltage difference Vgs of the transistor 165 must be larger than the Vt=1V of the transistor 165. So the maximum voltage the node 186 can reach in the third example when the circuit 100 is turned on is 11V−1V=10V.

The node 182 is electrically connected to the node 181 and has a same voltage as that of the node 181. That is, when the circuit 100 is turned off, the node 182 has the voltage 6V; when the circuit 100 is turned on, the node 182 has the voltage 0V. When the circuit 100 is turned off, the 6V voltage at the node 182 enables the transistors 171, 172 to be turned on. As such, the node 187 is electrically connected to the ground Vss 111, and has a voltage 0V. Here, the transistor 173 is turned off due to the 0V voltage at the node 186 when the circuit 100 is turned off as discussed above. Because the node 187 has the voltage 0V, the transistor 174 is turned off, and the node 188 is electrically connected to the ground Vss 111 and has a voltage 0V. In this case, the capacitor 123 is charged by the power supply pin VDD 103 via the diode-connected transistor 143. Because the diode-connected transistor 143 has a forward voltage Vf equal to its Vt, the node 189 has a maximum voltage of 6V−Vf=6V−1V=5V.

When the circuit 100 is turned on, the node 182, like the node 181, has the same voltage 0V as the ground Vss 111, which enables the transistors 171, 172 to be turned off. As discussed above, the node 186, which is electrically connected to the gate of the transistor 173, has a maximum voltage of 10V when the circuit 100 is turned on. As such, the transistor 173 is turned on and the node 187 is charged by the node 189. This induces the transistor 174 to be turned on, which enables the node 188 to be charged by the power supply pin VDD 103. As such, the voltage at the node 188 can maximally be charged to 6V, same as the voltage of the power supply pin VDD 102. Based on the 5V voltage difference stored by the capacitor 123 when the circuit 100 is off, the voltage at the node 189 can maximally be charged and increased to 6V+5V=11V, i.e. the voltage at the node 189 is boot-strapped to 11V.

While the node 187 is charged by the voltage 11V at the node 189, the voltage of the node 187 cannot reach 11V. Because the node 187 is electrically connected to the source of the transistor 173, to keep the transistor 173 on, the gate source voltage difference Vgs of the transistor 173 must be larger than the threshold voltage Vt=1V of the transistor 173. Because the gate of the transistor 173 is electrically connected to the node 186, which has a maximum voltage 10V when the circuit 100 is turned on, the maximum voltage the node 187 can reach in the third example when the circuit 100 is turned on is 10V−Vt=10V−1V=9V. Now the transistor 174 has a gate source voltage difference Vgs=9V−6V=3V, which is much larger than the threshold voltage Vt=1V of the transistor 174. This leaves enough voltage margin at the last stage of the multi-stage boot-strapped driver. That is, in the third example where the transistors 142, 143, 165, 166, 173, 174 have a smaller Vt=1V, there is enough over-drive voltage to drive the power switch HEMT 175. In addition, since all other transistors, including the power switch HEMT 175, in FIG. 1 are having a larger Vt=1.5V, the noise immunity of the output power switch 175 will be better than the second example, because a larger Vt of the power switch HEMT 175 can significantly withstand impulse voltage noise fed back from the drain of the power switch HEMT 175 to the gate of the power switch HEMT 175.

In various embodiments, the power switch HEMT 175 may have an even larger Vt like 2V. The disclosed circuit design for dual-Vt or multi-Vt transistors can reduce both Vt of the pull-up E-HEMT transistors and Vf of the diode-connected E-HEMT rectifiers of the multi-stage driver to provide enough over-drive voltage and dramatically reduce static current, without compromising the noise immunity of the output power switch. To use dual-Vt or multi-Vt transistors in a same IC, different metal gate materials can be used for different transistors formed on a same wafer. While a lower work-function material, e.g. tungsten (W) or titanium/tungsten/titanium-nitride (Ti/W/TiN) metal stack, can be used for implementing a high-Vt transistor; a higher work-function material, e.g. nickel (Ni) or titanium/nickel/titanium-nitride (Ti/Ni/TiN) metal stack, can be used for implementing a low-Vt transistor.

Figure 2:
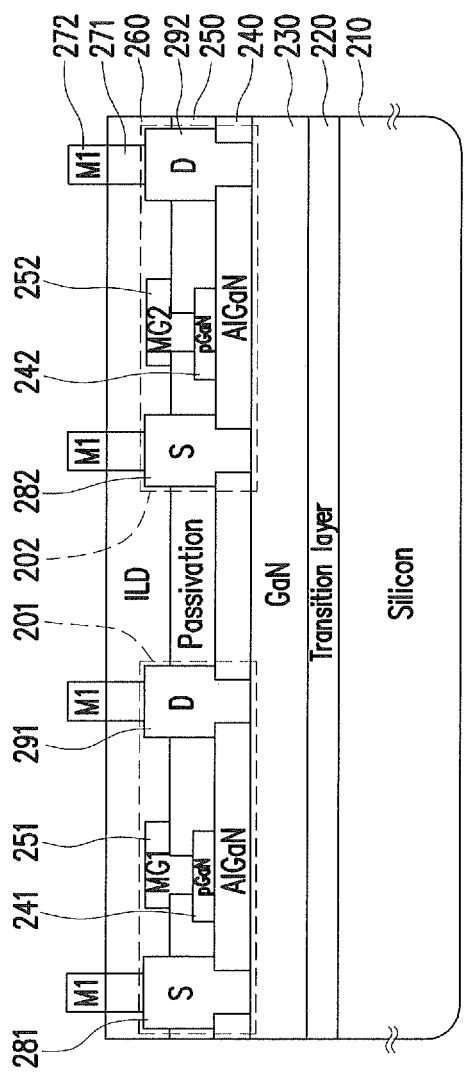
FIG. 2 illustrates a cross-sectional view of an exemplary semiconductor device including dual threshold voltage transistors, in accordance with some embodiments of the present disclosure.

FIG. 2 illustrates a cross-sectional view of an exemplary semiconductor device 200 including dual threshold voltage transistors, in accordance with some embodiments of the present disclosure. As shown in FIG. 2, the semiconductor device 200 in this example includes a silicon layer 210 and a transition layer 220 disposed on the silicon layer 210. The semiconductor device 200 further includes a first layer 230 comprising a first III-V semiconductor material formed over the transition layer 220.

The semiconductor device 200 further includes a second layer 240 (a polarization layer) comprising a second III-V semiconductor material disposed on the first layer 230. The second III-V semiconductor material is different from the first III-V semiconductor material. For example, the first III-V semiconductor material may be gallium nitride (GaN); while the second III-V semiconductor material may be aluminum gallium nitride (AlGaN).

As shown in FIG. 2, the semiconductor device 200 further includes a first transistor 201 and a second transistor 202 formed over the first layer 230. The first transistor 201 comprises a first gate structure 251 comprising a first material, a first source region 281 and a first drain region 291. The second transistor 202 comprises a second gate structure 252 comprising a second material, a second source region 282 and a second drain region 292. According to various embodiments, the first material is different from the second material.

The semiconductor device 200 further includes a polarization modulation layer 241, 242 disposed on the second layer 240, and a passivation layer 250 disposed partially on the polarization modulation layer and partially on the second layer 240. In one embodiment, the polarization modulation layer comprises p-type doped GaN (pGaN).

The sources 281, 282 and the drains 291, 292 of the two transistors 201, 202 are formed through the second layer 240 and the passivation layer 250, and disposed on the first layer 230. The first gate structure 251 is disposed on the pGaN portion 241 and between the first source region 281 and the first drain region 291. The second gate structure 252 is disposed on the pGaN portion 242 and between the second source region 282 and the second drain region 292.

In one embodiment, the first transistor 201 and the second transistor 202 are high electron mobility transistors to be used in a same multi-stage driver circuit. For example, the first transistor 201 is used as a power switch transistor and has a first threshold voltage. The second transistor 202 is used as a driver transistor and has a second threshold voltage that is lower than the first threshold voltage. Accordingly, the first material of the first gate structure 251 has a lower work-function than the second material of the second gate structure 252. For example, the first material comprises tungsten (W) and/or a titanium/tungsten/titanium-nitride (Ti/W/TiN) metal stack; and the second material comprises nickel (Ni) and/or a titanium/nickel/titanium-nitride (Ti/Ni/TiN) metal stack.

In addition, the semiconductor device 200 includes an interlayer dielectric (ILD) layer 260 disposed partially on the passivation layer 250 and partially on the first transistor 201 and the second transistor 202. The semiconductor device 200 also includes metal contacts 271 disposed on and in contact with the sources 281, 282 and the drains 291, 292 respectively, and includes a first metal layer 272 on the metal contacts 271.

Figure 3A:
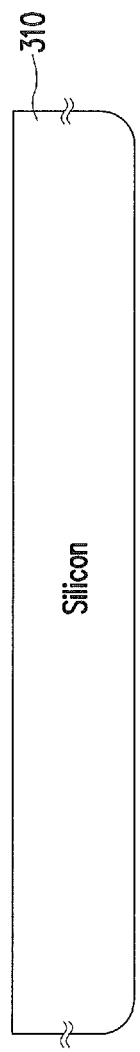

FIGS. 3A, 3B, 3C, 3D, 3E, 3F, 3G, 3H, 3I, 3J, 3K, 3L, 3M, 3N and 3O illustrate cross-sectional views of an exemplary semiconductor device during various fabrication stages, in accordance with some embodiments of the present disclosure. In some embodiments, the semiconductor device may be included in an integrated circuit (IC). In addition, FIGS. 3A through 3O are simplified for a better understanding of the concepts of the present disclosure. For example, although the figures illustrate two transistors, it is understood the semiconductor device may include more than two transistors, and the IC may include a number of other devices comprising resistors, capacitors, inductors, fuses, etc., which are not shown in FIGS. 3A through 3O, for purposes of clarity of illustration.

FIG. 3A is a cross-sectional view of the semiconductor device including a substrate 310, which is provided at one of the various stages of fabrication, according to some embodiments of the present disclosure. The substrate 310 may be formed of silicon, as shown in FIG. 3A, or another semiconductor material.

Figure 3B:
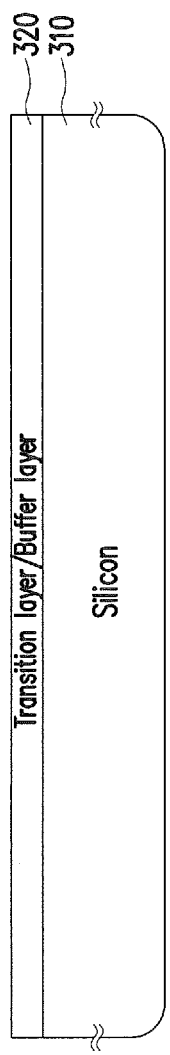

FIG. 3B is a cross-sectional view of the semiconductor device including a transition or buffer layer 320, which is formed on the substrate 310 at one of the various stages of fabrication, according to some embodiments of the present disclosure. The transition or buffer layer 320 may be formed by epitaxial growth. According to various embodiments, the transition or buffer layer 320 includes a nucleation layer of aluminum nitride (AlN) and serves as a buffer to reduce the stress between the substrate 310 and the layer on top of the transition or buffer layer 320. In one embodiment, the transition or buffer layer 320 and the operation step shown in FIG. 3B is optional and can be removed.

Figure 3C:
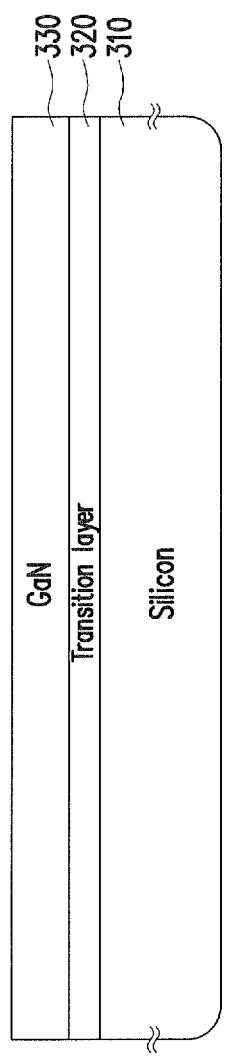

FIG. 3C is a cross-sectional view of the semiconductor device including a first III-V semiconductor material layer 330, which is formed optionally on the transition or buffer layer 320 or directly on the substrate 310 at one of the various stages of fabrication, according to some embodiments of the present disclosure. The first III-V semiconductor material layer 330 may be formed by epitaxial growth. According to various embodiments, the first III-V semiconductor material layer 330 includes a gallium nitride (GaN). When the first III-V semiconductor material layer 330 is formed on the transition or buffer layer 320, the transition or buffer layer 320 can reduce the stress between the substrate 310 and the first III-V semiconductor material layer 330. After transistors are formed over the first III-V semiconductor material layer 330, the first III-V semiconductor material layer 330 serves as a channel layer for the transistors.

Figure 3D:
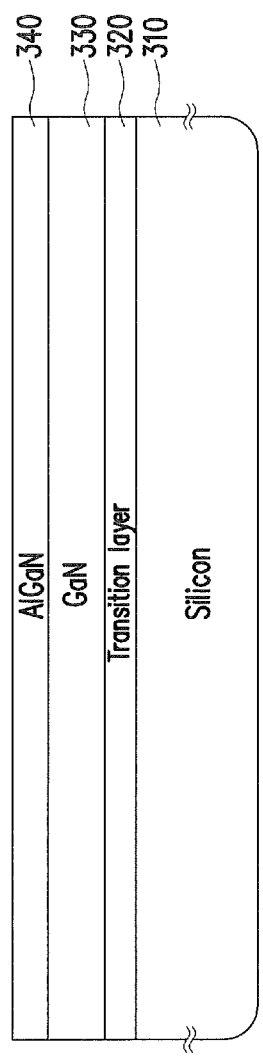

FIG. 3D is a cross-sectional view of the semiconductor device including a second III-V semiconductor material layer 340, which is formed on the first III-V semiconductor material layer 330 at one of the various stages of fabrication, according to some embodiments of the present disclosure. The second III-V semiconductor material layer 340 may be formed by epitaxial growth. According to various embodiments, the second III-V semiconductor material layer 340 includes an aluminum gallium nitride (AlGaN). After transistors are formed over the first III-V semiconductor material layer 330 and the second III-V semiconductor material layer 340, a 2-dimensional electron gas (2-DEG) will be formed at the interface between the first III-V semiconductor material layer 330 and the second III-V semiconductor material layer 340.

Figure 3E:
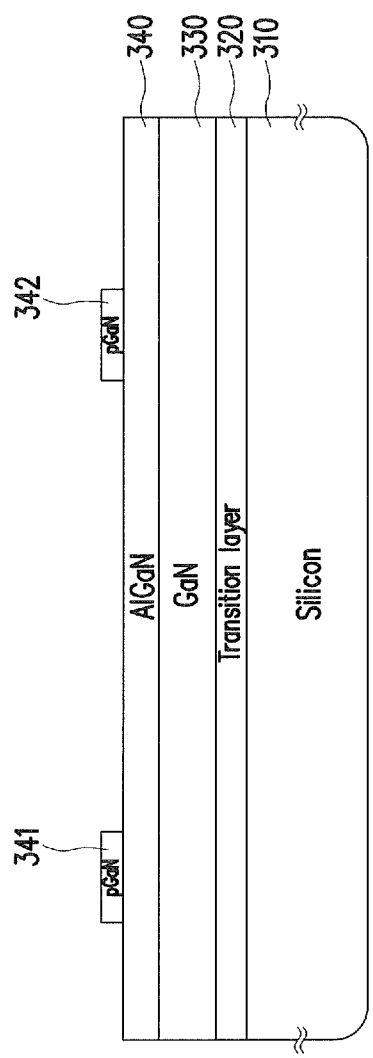

FIG. 3E is a cross-sectional view of the semiconductor device including a p-type doped GaN (pGaN) layer 341, 342, which is formed on the second III-V semiconductor material layer 340 at one of the various stages of fabrication, according to some embodiments of the present disclosure. The pGaN layer 341, 342 is patterned to form island regions shown in FIG. 3E. The patterning of the pGaN layer includes, e.g., (i) forming a masking layer (e.g., photoresist, etc.) over the pGaN layer, the masking layer including openings over the portions of the pGaN layer that are to be removed, and (ii) removing the portions of the pGaN layer that are left exposed by the masking layer (e.g., via a wet or dry etch procedure). The pGaN layer 341, 342 may be called a polarization modulation layer, which modulates the dipole concentration in the AlGaN layer 340 as result in changing the 2-DEG concentration in the AlGaN/GaN interface channel. While the polarization modulation layer is formed for an enhancement-mode (normally off) AlGaN/GaN HEMT, the polarization modulation layer is not needed in a depletion-mode (normally on) AlGaN/GaN HEMT.

Figure 3F:
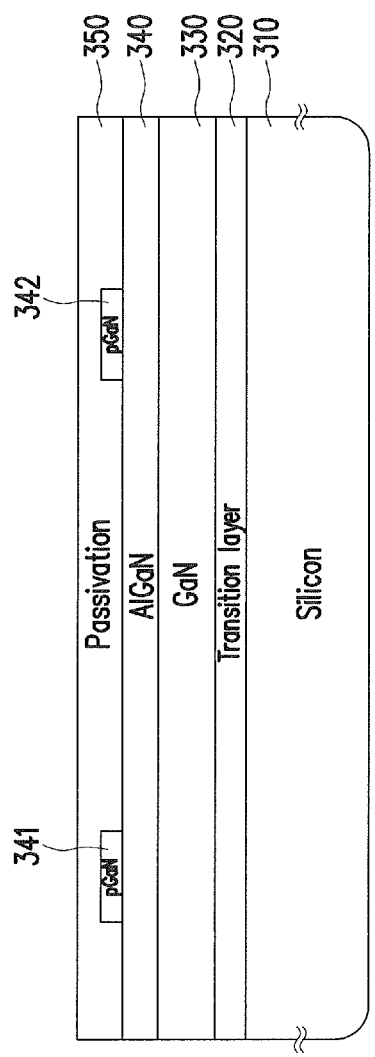

FIG. 3F is a cross-sectional view of the semiconductor device including a passivation layer 350, which is formed on the second III-V semiconductor material layer 340 and on the polarization modulation layer at one of the various stages of fabrication, according to some embodiments of the present disclosure. The passivation layer 350 is formed over the AlGaN layer 340 and over the remaining portions of the polarization modulation layer 341, 342. According to various embodiments, the passivation layer 350 is formed using a deposition procedure (e.g., chemical deposition, physical deposition, etc.). The passivation layer 350 may comprise silicon oxide, silicon nitride, silicon oxynitride, carbon doped silicon oxide, carbon doped silicon nitride, carbon doped silicon oxynitride, zinc oxide, zirconium oxide, hafnium oxide, titanium oxide, or another suitable material. In one embodiment, after depositing the passivation layer 350, the passivation layer 350 undergoes a polishing and/or etching procedure. The polishing and/or etching procedure includes, e.g. a chemical-mechanical planarization (CMP) (i.e., chemical-mechanical polishing) process that is used to polish the surface of the passivation layer 350 and remove topographical irregularities.

Figure 3G:
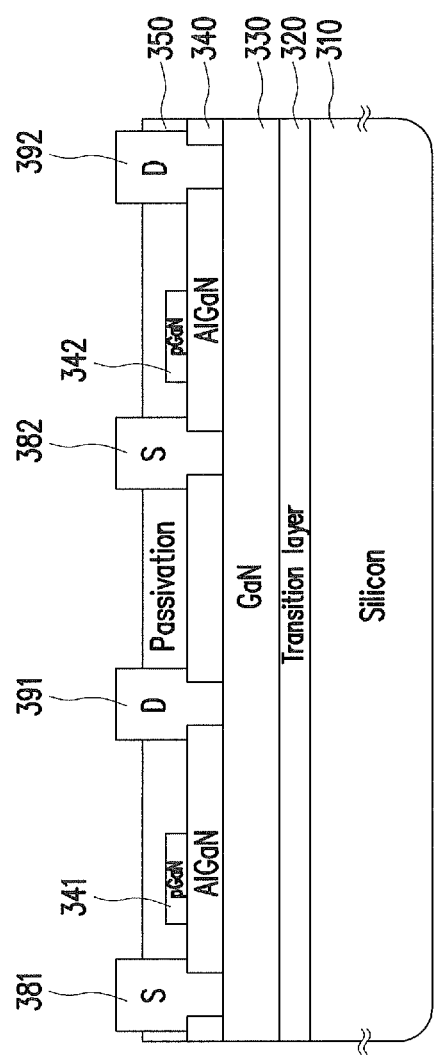

FIG. 3G is a cross-sectional view of the semiconductor device including source and drain contacts 381, 391, 382, 392, which are formed through the second III-V semiconductor material layer 340 and the passivation layer 350 and disposed on the first III-V semiconductor material layer 330 at one of the various stages of fabrication, according to some embodiments of the present disclosure. The source and drain contacts may be formed as non-rectifying electrical junctions, i.e. ohmic contacts.

Figure 3H:
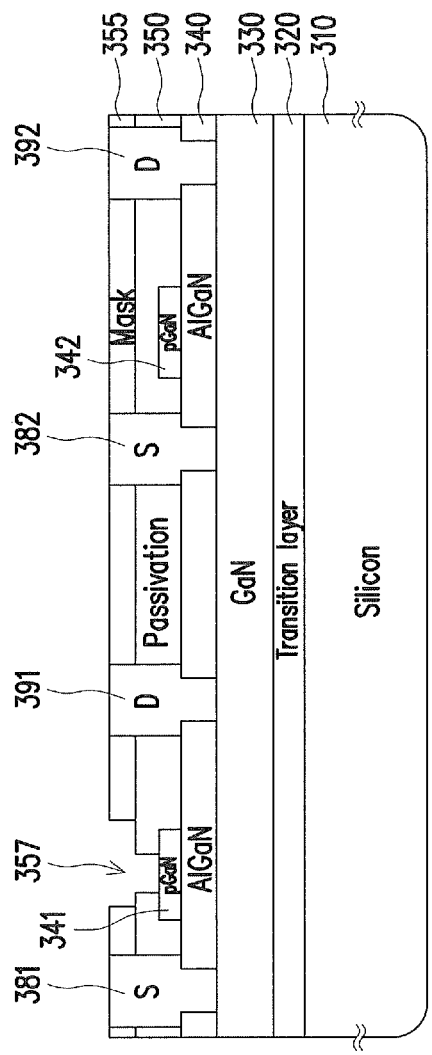
Figure 31:
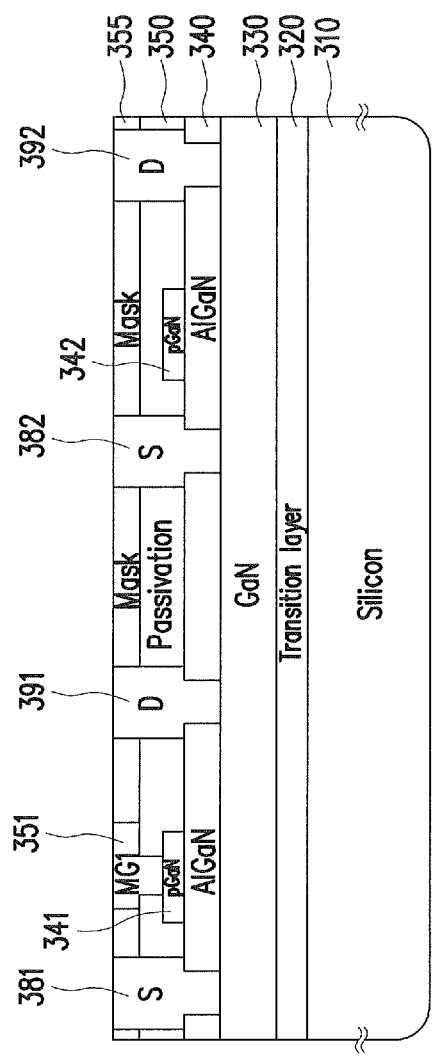

FIG. 3H is a cross-sectional view of the semiconductor device including a mask 355, which is formed on the passivation layer 350 at one of the various stages of fabrication, according to some embodiments of the present disclosure. At this stage, the mask 355 has a pattern to expose a portion of the passivation layer 350 on top of the pGaN portion 341 between the first pair of source 381 and drain 391. As such, a first opening 357 is formed on the pGaN portion 341 by etching the passivation layer 350 with the patterned mask 355.

FIG. 3I is a cross-sectional view of the semiconductor device including a first gate 351, which is deposited and polished in the first opening 357 between the first source 381 and the first drain 391 at one of the various stages of fabrication, according to some embodiments of the present disclosure. According to various embodiments, the first gate 351 may be formed of different metal materials with different work functions. As the work-function of the material in the first gate 351 decreases, the threshold voltage Vt of the first transistor formed of the first gate 351, the first source 381 and the first drain 391 will increase. As the work-function of the material in the first gate 351 increases, the threshold voltage Vt of the first transistor formed of the first gate 351, the first source 381 and the first drain 391 will decrease.

Figure 3J:
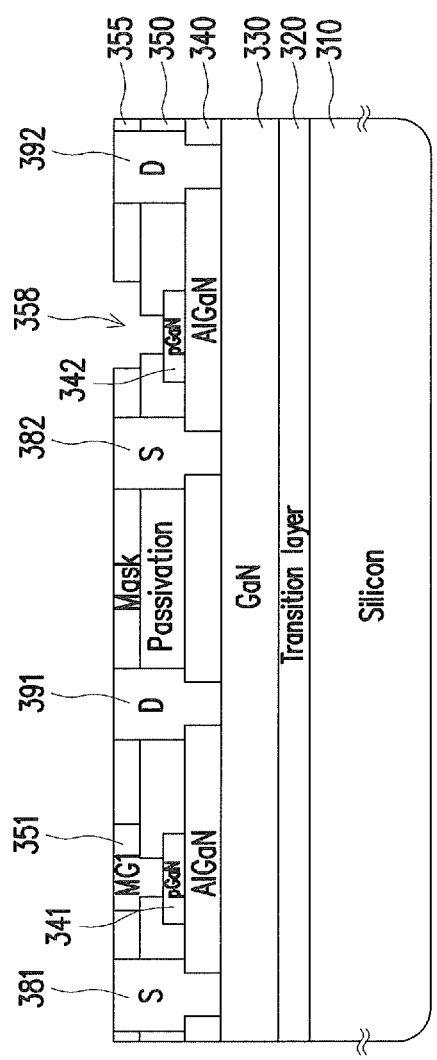

FIG. 3J is a cross-sectional view of the semiconductor device including a patterned mask 355, which is formed on the passivation layer 350 at one of the various stages of fabrication, according to some embodiments of the present disclosure. At this stage, the patterned mask 355 has a pattern to expose a portion of the passivation layer 350 on top of the pGaN portion 342 between the second pair of source 382 and drain 392. As such, a second opening 358 is formed on the pGaN portion 342 by etching the passivation layer 350 with the patterned mask 355.

Figure 3K:
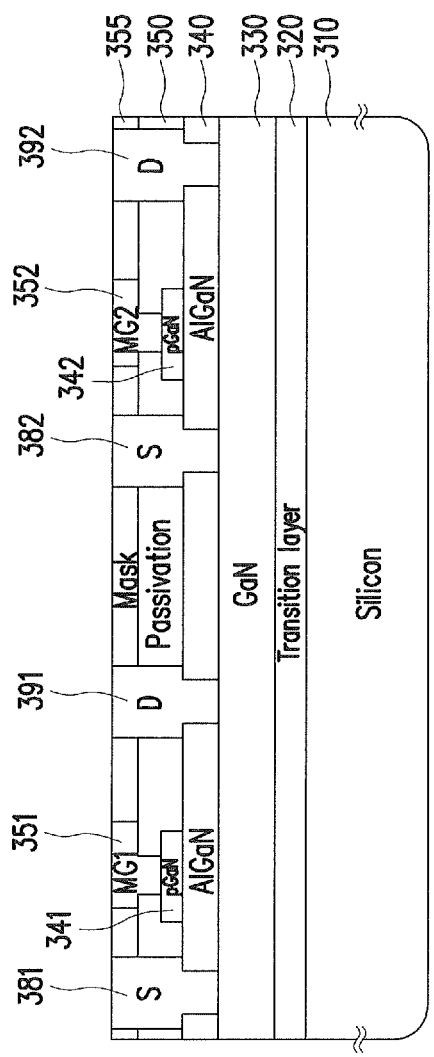

FIG. 3K is a cross-sectional view of the semiconductor device including a second gate 352, which is deposited and polished in the second opening 358 between the second source 382 and the second drain 392 at one of the various stages of fabrication, according to some embodiments of the present disclosure. According to various embodiments, the second gate 352 may be formed of different metal materials with different work functions. In particular, the material of the second gate 352 may have a different work function compared to the material of the first gate 351. For example, when the material of the second gate 352 has a larger work function compared to the material of the first gate 351, the second transistor formed of the second gate 352, the second source 382 and the second drain 392 will have a lower threshold voltage Vt compared to the first transistor formed of the first gate 351, the first source 381 and the first drain 391. That is, the two transistors formed on a same substrate have different threshold voltages and can be used as HEMTs in a same IC as shown in FIG. 1.

Figure 3L:
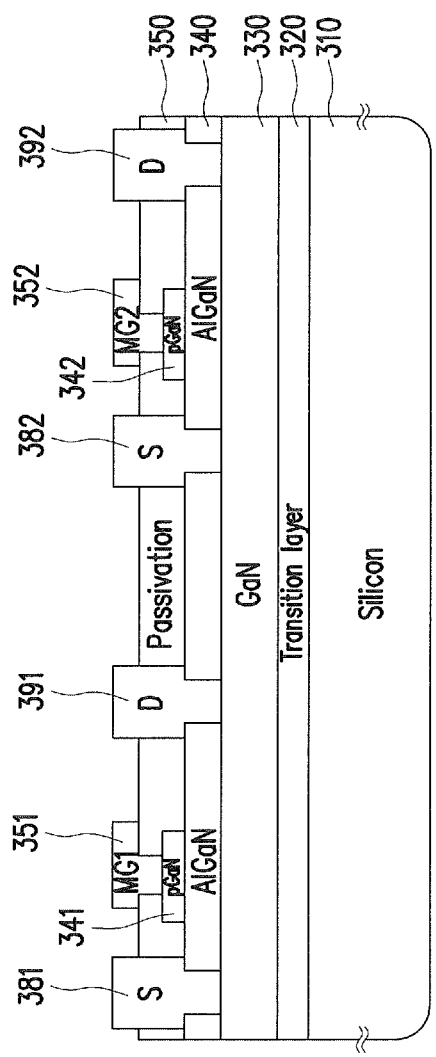

FIG. 3L is a cross-sectional view of the semiconductor device, where the mask 355 is removed from the passivation layer 350 after the metal gates are formed, at one of the various stages of fabrication, according to some embodiments of the present disclosure. After the mask 355 is removed, each of the source regions 381, 382, the drain regions 391, 392, and the gate structures 351, 352 has an exposed portion on top of the passivation layer 350.

Figure 3M:
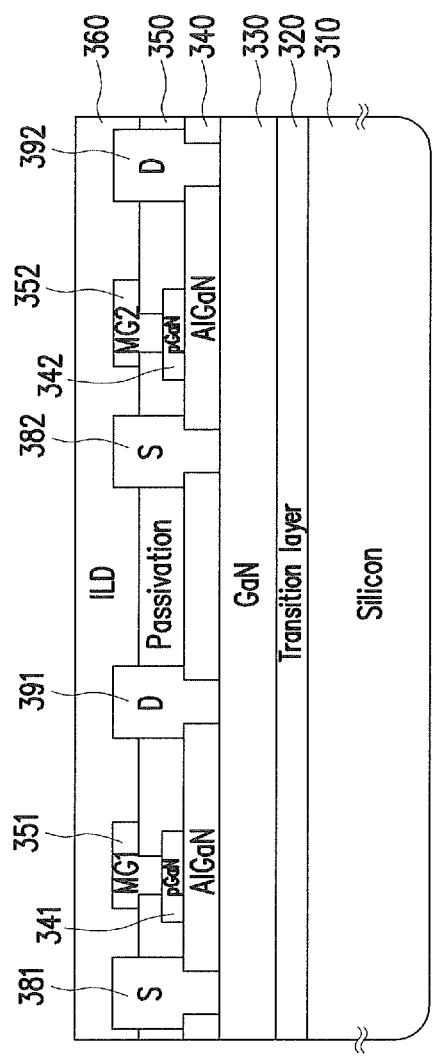

FIG. 3M is a cross-sectional view of the semiconductor device including an interlayer dielectric (ILD) layer 360, which is formed on the passivation layer 350, at one of the various stages of fabrication, according to some embodiments of the present disclosure. The ILD layer 360 covers the passivation layer 350 and the exposed portions of the source regions 381, 382, the drain regions 391, 392, and the gate structures 351, 352 that are formed at the stage shown in FIG. 3L. The ILD layer 360 is formed of a dielectric material and may be patterned with holes for metal interconnects or contacts for the source and drain contacts 381, 382, 391, 392 as well as the gate structures 351, 352.

Figure 3N:
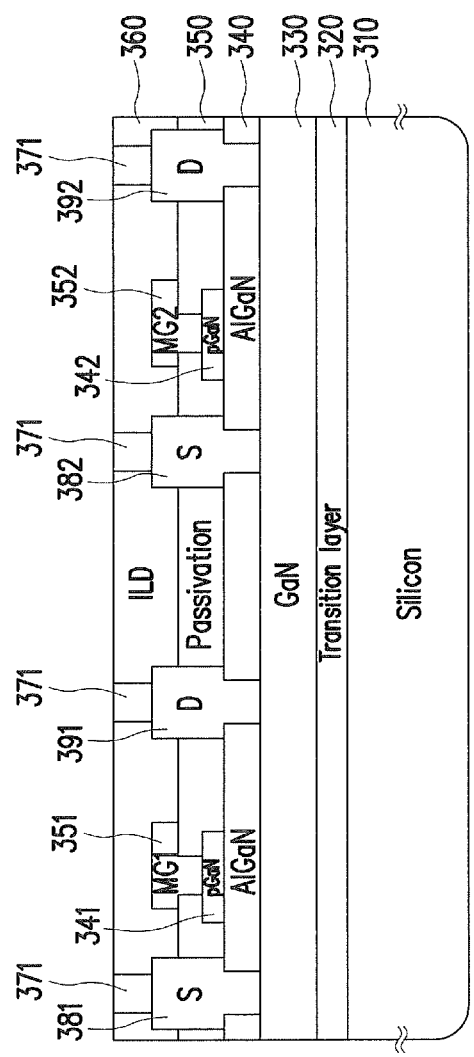
Figure 30:
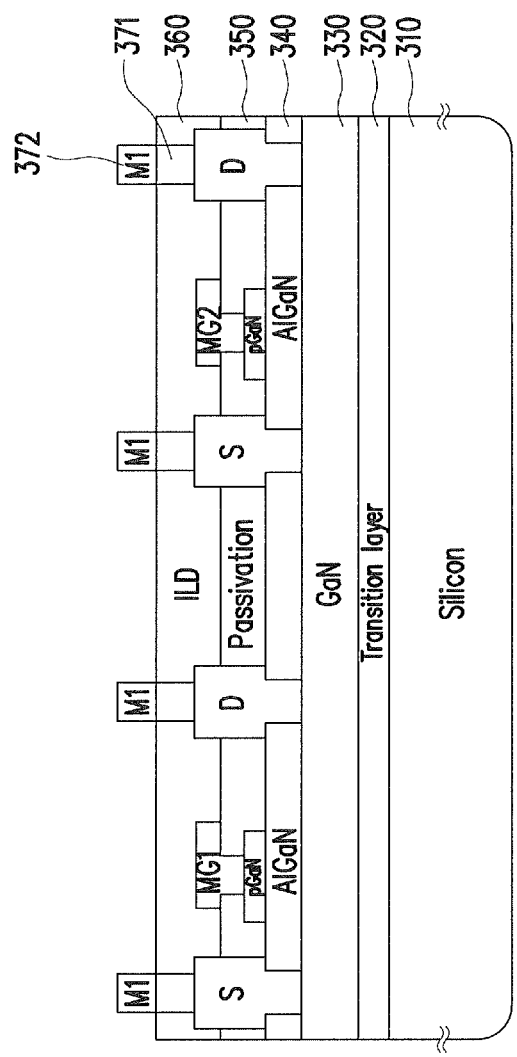

FIG. 3N is a cross-sectional view of the semiconductor device including metal contacts 371, each of which is formed on a source or drain contact, at one of the various stages of fabrication, according to some embodiments of the present disclosure. As discussed above, the ILD layer 360 is patterned with holes each of which is on one of the source and drain contacts 381, 382, 391, 392. As such, the metal contacts 371 can be formed in these holes to be in contact with the source and drain contacts 381, 382, 391, 392, respectively.

FIG. 3O is a cross-sectional view of the semiconductor device including a first metal layer 372, which is formed on the metal contacts 371, at one of the various stages of fabrication, according to some embodiments of the present disclosure. The first metal layer 372 includes metal material and is formed over the ILD layer 360 and in contact with the metal contacts 371.

Figure 4A:
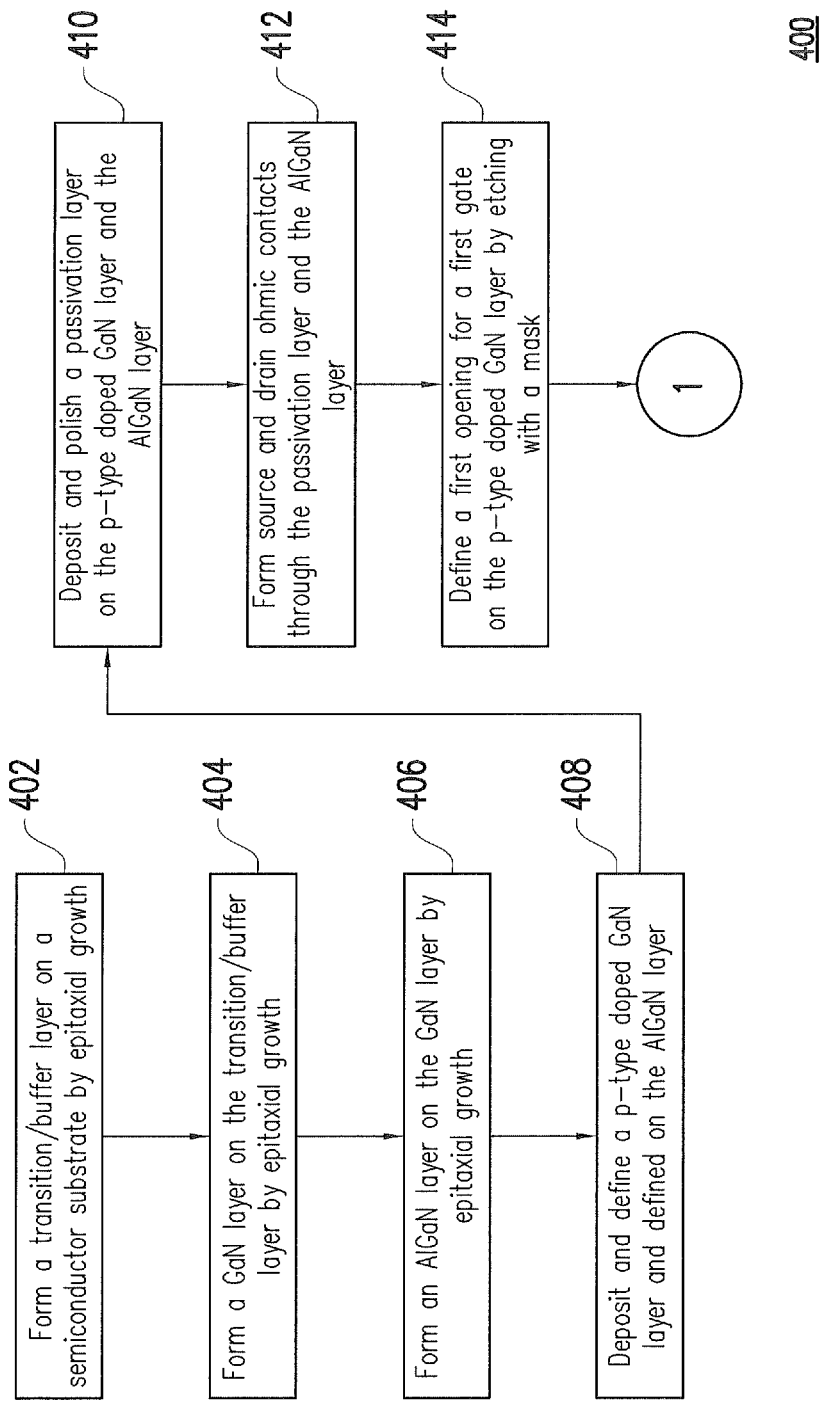
FIG. 4A and FIG. 4B show a flow chart illustrating an exemplary method for forming a semiconductor device including dual threshold voltage transistors, in accordance with some embodiments of the present disclosure.
Figure 4B:
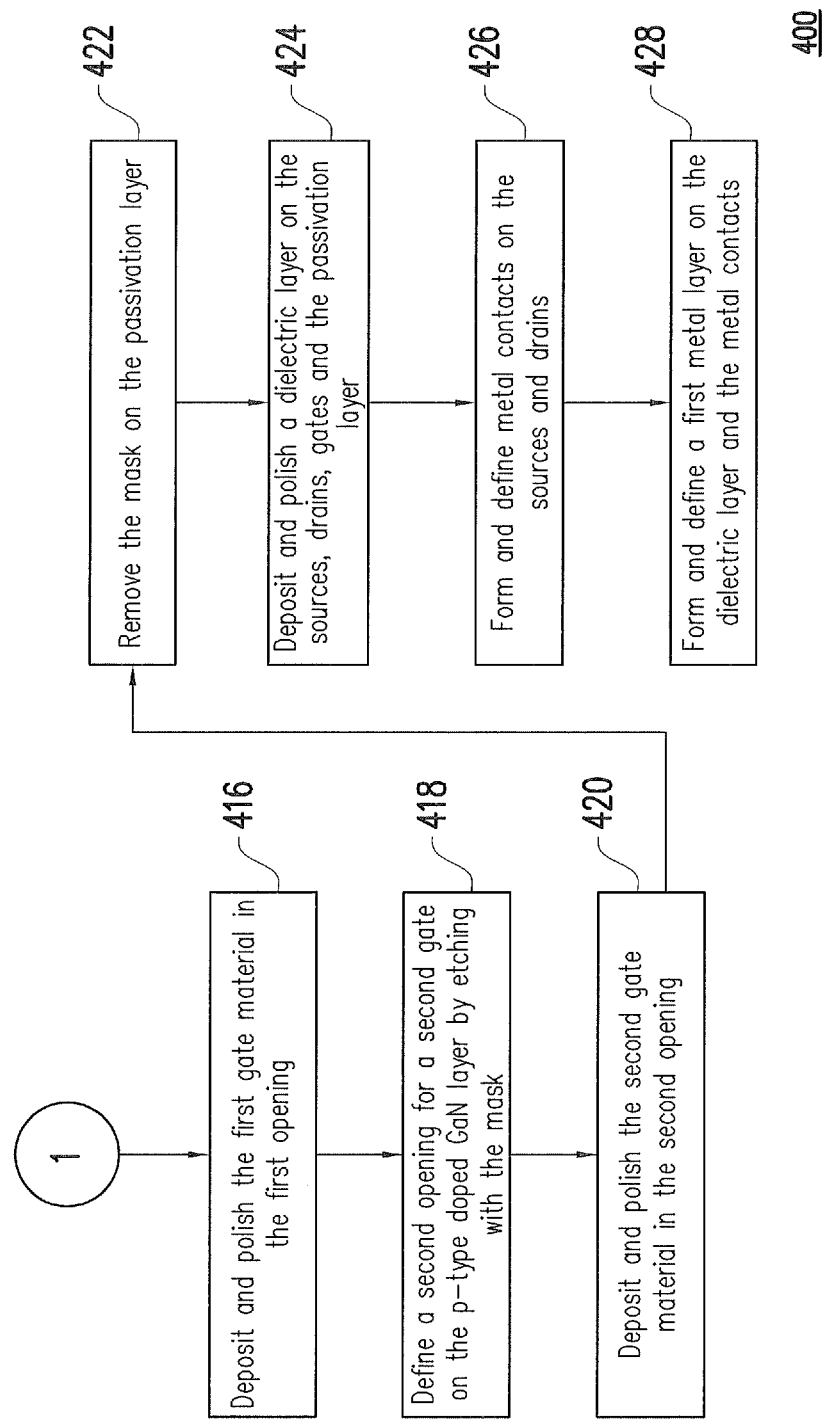

FIG. 4A and FIG. 4B show a flow chart illustrating an exemplary method 400 for forming a semiconductor device including dual threshold voltage transistors, in accordance with some embodiments of the present disclosure. As shown in FIG. 4A, at operation 402, a transition/buffer layer is formed on a semiconductor substrate by epitaxial growth. A GaN layer is formed at operation 404 on the transition/buffer layer by epitaxial growth. At operation 406, an AlGaN layer is formed on the GaN layer by epitaxial growth. At operation 408, a p-type doped GaN layer is deposited and defined on the AlGaN layer. At operation 410, a passivation layer is deposited and polished on the p-type doped GaN layer and the AlGaN layer. Source and drain ohmic contacts are formed at operation 412 through the passivation layer and the AlGaN layer. At operation 414, a first opening is defined for a first gate on the p-type doped GaN layer by etching with a mask. The process then goes to the operation 416 in FIG. 4B.

As shown in FIG. 4B, at operation 416, the first gate material is deposited and polished in the first opening. A second opening is defined at operation 418 for a second gate on the p-type doped GaN layer by etching with the mask. At operation 420, the second gate material is deposited and polished in the second opening. At operation 422, the mask on the passivation layer is removed. At operation 424, a dielectric layer is deposited and polished on the sources, drains, gates and the passivation layer. Metal contacts are formed and defined at operation 426 on the sources, drains and gates. At operation 428, a first metal layer is formed and defined on the dielectric layer and the metal contacts. The order of the operations shown in FIG. 4A and FIG. 4B may be changed according to different embodiments of the present disclosure.

In an embodiment, a semiconductor structure is disclosed. The semiconductor structure includes: a substrate; a first layer comprising a first III-V semiconductor material formed over the substrate; a first transistor formed over the first layer, and a second transistor formed over the first layer. The first transistor comprises a first gate structure comprising a first material, a first source region and a first drain region. The second transistor comprises a second gate structure comprising a second material, a second source region and a second drain region. The first material is different from the second material.

In another embodiment, a circuit is disclosed. The circuit includes a first transistor including a first gate, a first source and a first drain; and a second transistor including a second gate, a second source and a second drain. The first transistor and the second transistor are formed on a same semiconductor wafer. The second gate is made of a material that is different from that of the first gate.

In yet another embodiment, a method for forming a semiconductor structure is disclosed. The method includes: forming a first layer comprising a first III-V semiconductor material over a semiconductor substrate; forming a first transistor over the first layer, wherein the first transistor comprises a first gate structure comprising a first material, a first source region and a first drain region; and forming a second transistor over the first layer, wherein the second transistor comprises a second gate structure comprising a second material, a second source region and a second drain region, wherein the first material is different from the second material.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a substrate;
 a first layer comprising a first III-V semiconductor material formed over the substrate;
 a polarization modulation layer disposed above the first layer;
 a passivation layer disposed at least partially on the polarization modulation layer;
 a first transistor formed over the substrate, wherein the first transistor comprises a first gate structure comprising a first material, a first source region and a first drain region; and a second transistor formed next to the first transistor over the substrate, wherein the second transistor comprises a second gate structure comprising a second material, a second source region and a second drain region, wherein:

the first gate structure is disposed partially on the polarization modulation layer and partially on the passivation layer;

the second gate structure is disposed partially on the polarization modulation layer and partially on the passivation layer; and the first material has a different work function than that of the second material.

2. The semiconductor structure of claim 1, further comprising a multi-stage driver circuit, wherein the multi-stage driver circuit comprises the first transistor and the second transistor.

3. The semiconductor structure of claim 1, wherein:
the second threshold voltage is lower than the first threshold voltage.

4. The semiconductor structure of claim 3, wherein:
the first material has a lower work-function than the second material.

5. The semiconductor structure of claim 4, wherein:
the first material comprises at least one of: tungsten (W) and titanium/tungsten/titanium-nitride (Ti/W/TiN) metal stack; and
the second material comprises at least one of: nickel (Ni) and titanium/nickel/titanium-nitride (Ti/Ni/TiN) metal stack.

6. The semiconductor structure of claim 1, further comprising:
a second layer comprising a second III-V semiconductor material disposed on the first layer; wherein:
the polarization layer is disposed on the second layer;
the second III-V semiconductor material is different from the first III-V semiconductor material;
the first gate structure is formed between the first source region and the first drain region; and
the second gate structure is formed between the second source region and the second drain region.

7. The semiconductor structure of claim 6, wherein:
the first III-V semiconductor material comprises gallium nitride (GaN); and
the second III-V semiconductor material comprises aluminum gallium nitride (AlGaN).

8. The semiconductor structure of claim 1, wherein:
the polarization modulation layer comprises p-type doped GaN;
the passivation layer comprises at least one of: silicon oxide, silicon nitride, silicon oxynitride, carbon doped silicon oxide, carbon doped silicon nitride, carbon doped silicon oxynitride, zinc oxide, zirconium oxide, hafnium oxide, or titanium oxide; and
each of the first source region, the first drain region, the second source region, and the second drain region is formed through the second layer and the passivation layer, and disposed on and in contact with the first layer.

9. A circuit, comprising:
a first transistor including a first gate, a first source and a first drain; and
a second transistor including a second gate, a second source and a second drain, wherein:
the first transistor and the second transistor are formed next to each other on a same semiconductor wafer comprising a substrate,
a first layer comprising a first III-V semiconductor material is disposed over the substrate,
a polarization modulation layer is disposed above the first layer,
a passivation layer is disposed at least partially on the polarization modulation layer,
the first gate is disposed partially on the polarization modulation layer and partially on the passivation layer,
the second gate is disposed partially on the polarization modulation layer and partially on the passivation layer, and
the second gate comprises a material that has a different work function than a material of the first gate.

10. The circuit of claim 9, wherein:
the first transistor has a first threshold voltage; and
the second transistor has a second threshold voltage that is different from the first threshold voltage.

11. The circuit of claim 9, further comprising:
a second layer comprising a second III-V semiconductor material disposed on the first layer, wherein:
the second III-V semiconductor material is different than the first III-V semiconductor material;
the polarization modulation layer is disposed on the second layer;
at least one of the first source and the first drain is electrically coupled to a ground voltage; and
at least one of the second source and the second drain is electrically coupled to a positive power supply voltage.

12. The circuit of claim 10, wherein the first threshold voltage is higher than the second threshold voltage.

13. The circuit of claim 12, wherein:
the first gate is made of a first material;
the second gate is made of a second material; and
the first material has a lower work-function than the second material.

14. The circuit of claim 12, wherein at least one of the first source and the first drain is electrically coupled to an output pin of the circuit, wherein the output pin comprises an electrical contact.

15. The circuit of claim 12, wherein each of the first transistor and the second transistor is at least one of:
an enhancement-mode high electron mobility transistor (E-HEMT); or
a depletion-mode high electron mobility transistor (D-HEMT).

16. A method for forming a semiconductor structure, comprising:
forming a first layer comprising a first III-V semiconductor material over a substrate;
forming a polarization modulation layer above the first layer;
forming a passivation layer at least partially on the polarization modulation layer;
forming a first transistor over the substrate, wherein the first transistor comprises a first gate structure comprising a first material, a first source region and a first drain region; and
forming a second transistor next to the first transistor over the substrate, wherein the second transistor comprises a second gate structure comprising a second material, a second source region and a second drain region, wherein the first transistor and the second transistor are both high electron mobility transistors, wherein:
the first gate structure is formed partially on the polarization modulation layer and partially on the passivation layer;

the second gate structure is formed partially on the polarization modulation layer and partially on the passivation layer; and the first material has a different work function than that of the second material.

17. The method of claim 16, further comprising a same-multi-stage driver circuit, wherein the multi-stage driver circuit comprises the first transistor and the second transistor; and wherein the first material has a lower work-function than the second material.

18. The method of claim 16, further comprising:

forming a second layer comprising a second III-V semiconductor material on the first layer, wherein the polarization modulation layer is formed on the second layer.

19. The method of claim 18, wherein:

the first III-V semiconductor material comprises gallium nitride (GaN); and the second III-V semiconductor material comprises aluminum gallium nitride (AlGaN).

20. The method of claim 16, wherein:

the first gate structure is formed between the first source region and the first drain region; and the second gate structure is formed between the second source region and the second drain region.

* * * * *